(12) United States Patent
Yamashita

(10) Patent No.: US 9,678,134 B2
(45) Date of Patent: Jun. 13, 2017

(54) METHOD FOR DETERMINING MAINTENANCE TIME FOR CONTACTS, AND TESTING APPARATUS

(71) Applicant: NIDEC-READ CORPORATION, Kyoto (JP)

(72) Inventor: Munehiro Yamashita, Kyoto (JP)

(73) Assignee: Nidec-Read Corporation, Kyoto (JP)

( * ) Notice: Subject to any disclaimer, the term of this patent is extended or adjusted under 35 U.S.C. 154(b) by 154 days.

(21) Appl. No.: 14/528,115

(22) Filed: Oct. 30, 2014

(65) Prior Publication Data

US 2015/0115974 A1    Apr. 30, 2015

(30) Foreign Application Priority Data

Oct. 31, 2013   (JP) ................................. 2013-226365

(51) Int. Cl.
    *G01R 31/04* (2006.01)
    *G01R 3/00* (2006.01)
    G01R 31/28 (2006.01)

(52) U.S. Cl.
    CPC .............. *G01R 31/04* (2013.01); *G01R 3/00* (2013.01); *G01R 31/2808* (2013.01)

(58) Field of Classification Search
    CPC ...................................................... G01R 31/04
    USPC ........................................................ 324/538
    See application file for complete search history.

(56) References Cited

U.S. PATENT DOCUMENTS

| | | | | |
|---|---|---|---|---|
| 4,342,957 A | * | 8/1982 | Russell | G01R 31/025 324/538 |
| 5,677,839 A | * | 10/1997 | Kondo | F16H 61/12 340/663 |
| 2006/0292710 A1 | * | 12/2006 | Golner | G01R 31/3333 438/14 |
| 2008/0024139 A1 | * | 1/2008 | Iacovella | G01R 31/046 324/522 |
| 2009/0308734 A1 | * | 12/2009 | Krauss | H01J 37/32935 204/192.13 |
| 2012/0025844 A1 | * | 2/2012 | Morita | B60L 3/0023 324/538 |
| 2013/0221973 A1 | * | 8/2013 | Whisenand | G01R 31/1272 324/501 |
| 2013/0293188 A1 | * | 11/2013 | Bandai | H02J 7/0068 320/107 |
| 2014/0306732 A1 | * | 10/2014 | Jost | H01F 38/30 324/762.03 |

FOREIGN PATENT DOCUMENTS

JP        07161783 A    6/1995

* cited by examiner

*Primary Examiner* — Son Le
*Assistant Examiner* — Akm Zakaria
(74) *Attorney, Agent, or Firm* — Wiggin and Dana LLP; Abraham Kasdan; Jonathan D. Hall

(57) ABSTRACT

A method for maintaining a contact of a connection jig for connecting between a target object to be subjected to an electrical test and a testing apparatus configured to conduct the electrical test on the target object includes: detecting a change in voltage upon supply of power for the electrical test to a test point on the target object through the contact; and issuing maintenance information indicating the contact is abnormal, upon detection of a portion where the voltage does not successively rise.

3 Claims, 5 Drawing Sheets

METHOD FOR DETERMINING MAINTENANCE TIME FOR CONTACTS, AND TESTING APPARATUS

CROSS REFERENCE TO RELATED APPLICATION

This application is based on and claims priority from Japanese Patent Application No. 2013-226365, filed on Oct. 31, 2013, the contents of which are hereby incorporated by reference in their entirety.

BACKGROUND

Technical Field

This disclosure relates to a method for determining if maintenance is required on a contact of a connection jig. The connection jig uses multiple contacts to electronically connect a target object to be tested to a testing apparatus configured to test an electrical characteristic. More specifically, the disclosure relates to methods for determining if maintenance is needed on a contact, by determining when a contact of a connection jig should be replaced; and prompting a user to replace the contact before occurrence of a contact connection failure. The disclosure also relates to a testing apparatus having such contact maintenance function.

Related Art

In a typical circuit board, wires serve as paths through which ICs (Integrated Circuits), semiconductor components, and other electronic components transmit and receive electric signals to and from one another. With recent miniaturization of electronic components, such wires are being formed more finely, have become more complicated and also have been formed with lower resistance. As wires on a circuit board are formed more finely, a test as to whether or not the wire is defective has been required to be conducted with high accuracy. The test as to whether or not a wire is defective involves testing a continuity state and an insulation state of the wire. The continuity state is determined from a calculated resistance value between two test points defined on a wire. The insulation state is determined from a calculated resistance value between a wire to be tested and a different wire from the wire to be tested.

Wires are subjected to the tests described above by bringing a tip end of a conductive contact into contact with a test point defined on each wire. The contact establishes an electrical connection between the test point on the wire and a testing apparatus. The continuity test and the insulation test are conducted on the wires on the basis of electric signals transmitted and received by the testing apparatus.

As described above, a contact is configured to establish electrical connection between a testing apparatus and a test point. The contact generally has an elongated rod shape. Examples thereof may include a contact formed into a conductive probe shape, and a contact having a spring that expands and contracts in the longitudinal direction. The contact is a constituent of a testing jig having a plurality of contacts. In such testing jig, each of the contacts has a leading end that comes into contact with a test point, and a trailing end that comes into contact with an electrode of the testing jig that is electrically connected to a testing apparatus. In an actual test, the test point and the electrode are pressed against the contact so as to ensure the stability of electrical contact.

In a testing jig, the number of contacts corresponds to the number of test points to be defined on wires on a circuit board. A testing jig may have several hundred to several thousand contacts, depending on the type. The contacts of the testing jig repeatedly make contact with and release from wires on a circuit board. The contacts are used for testing a large number of circuit boards, for example, not less than 50,000 circuit boards per day. In such a case, each contact may repeatedly make contact with and release from wires 50,000 times each day. Therefore, the contact is required to be durable and also has to be quickly replaceable if the contact is determined to be abnormal.

As described above, a contact repeatedly contacts with and releases from a test point. In a case where the test point is formed of a solder bump, a fragment of the solder bump may adhere to the contact when the contact comes into contact with the solder bump. The fragment of the solder bump affects the contact state of the contact with the test point, which may result in failure to accurately conduct the test. Moreover, the contact, which repeatedly contacts with and releases from the test point many times, may become bent at a tip end thereof. The bent contact has to be replaced with a new one. However, when testing to determine whether or not a wire is defective, when the wire is determined to be defective, then further tests are needed to determine whether or not the wire is actually defective or whether or not the contact is abnormal.

Therefore, an abnormal contact cannot be recognized until a defective wire is detected. Japanese Patent Application JP 7-161783 A for example, discloses a technique for overcoming such a drawback. According to the technique disclosed in JP 7-161783 A, a tip end of a contact is irradiated with a laser beam in order to determine whether or not the contact is abnormal.

However, such method of detecting an abnormal contact requires additional time and effort. That is, the method requires a laser emitting mechanism (laser emitting part, light receiving part) for emitting the laser beam, and includes a step of determining whether or not the contact is abnormal.

SUMMARY

In view of the circumstances described above, the present disclosure provides a method of conducting a continuity test on a wire to be tested and, concurrently, determining the state of the contact to the wire, thereby detecting if a contact should be replaced before the contact fails, without requiring a special step of testing such a contact One or more embodiments of the disclosure provide a method for determining when maintenance is needed on a contact of a connection jig for connecting between a target object to be subjected to an electrical test and a testing apparatus configured to conduct the electrical test on the target object. The method includes: bringing a plurality of contacts of the connection jig into contact with a plurality of test points defined on the target object, wherein the contacts correspond to the test points; selecting the test point to be tested from the target object, and supplying power for the electrical test to the selected test point through the corresponding contact; detecting a change in voltage at the contact to which the power is supplied; and issuing maintenance information indicating that the contact is abnormal, upon detecting if the voltage does not successively rise.

In one or more embodiments of the disclosure, the electrical test conducted on the target object may be a continuity test for determining a continuity state between the selected test points.

In one or more embodiments of the disclosure, maintenance information indicating that the contact is abnormal may be issued when a portion where the voltage does not successively rise is detected in a voltage interval that increases up to a preset voltage value and when a portion where the voltage does not successively rise is detected again in a period of time from the preset voltage value to a voltage value set to be higher than the preset voltage value.

One or more embodiments of the disclosure provide a testing apparatus for conducting an electrical test on a target object and determining when maintenance is needed on a contact of a connection jig for connecting between the target object and the testing apparatus. The testing apparatus includes: a power supply part configured to supply power for conducting a continuity test on the target object; a detection part configured to detect a value of voltage applied to the target object by the power supply part; and a determination part configured to determine that a contact electrically connecting between the target object and the power supply part is abnormal, upon detection of a portion where the voltage value does not successively increase over a period of time when the power supply part supplies the power for conducting the continuity test to the target object.

The method and apparatus according to one or more embodiments of the disclosure are capable of detecting an abnormal contact that is in electrical contact with a target object. Therefore, the method and the apparatus are capable of detecting a time to replace the contact with a new one before the contact becomes unusable. Heretofore, a test as to whether or not a contact is abnormal has been conducted only after a defective state is detected during a continuity test or a short-circuit test. On the other hand, the method and the apparatus do not require such a retest, and can eliminate a defective state due to an abnormal contact. Thus, the method and the apparatus prevent reduction in productivity due to an abnormal contact. Therefore, the method and the apparatus are capable of improving productivity.

The method according to one or more embodiments of the disclosure is capable of determining whether or not maintenance is needed on a contact in a continuity test. Therefore, the method is capable of testing the contact without a separate step of determining whether or not the contact is abnormal.

The method according to one or more embodiments of the disclosure is capable of detecting a change in voltage in a multilevel manner. Therefore, the method is capable of shortening a testing time and is capable of detecting an abnormal contact with high accuracy.

The foregoing and other objects, features, aspects and advantages of the invention will become more apparent from the following detailed description, when taken in conjunction with the accompanying drawings.

DETAILED DESCRIPTION

The following description will be given of the best mode for embodying the disclosure.

First, a description will be given of the basic concept of the disclosure. The disclosure intends, in a case of conducting a continuity test on a target object, to manage the maintenance of a contact that is in contact with the target object, using a power supply provided for conducting the continuity test.

Figure 1:
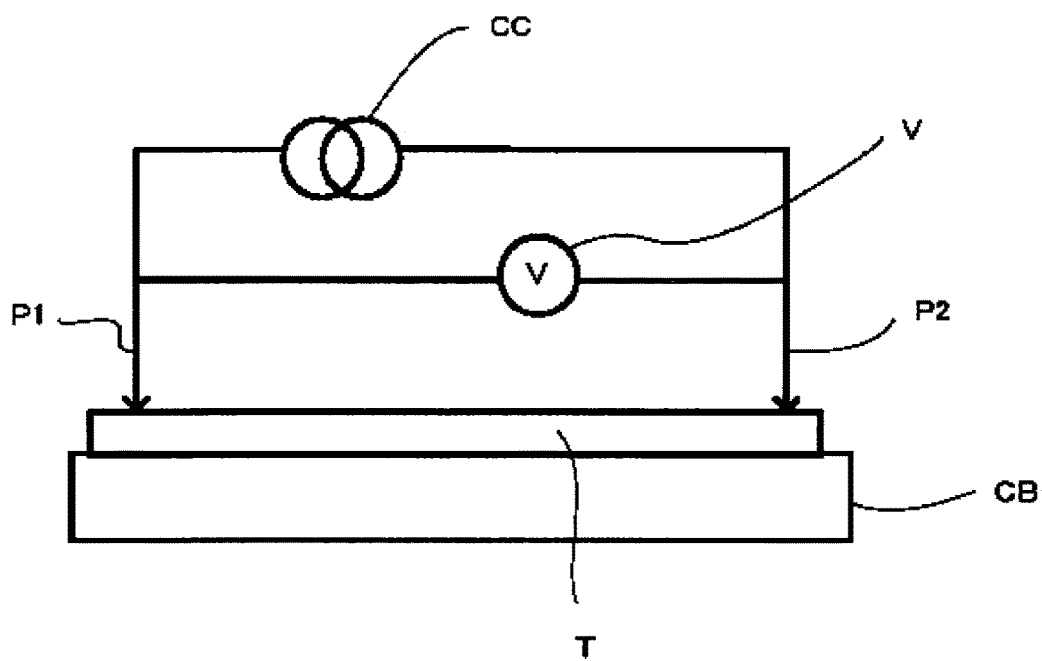
FIG. 1 is a schematic side view for illustrating a continuity test.

FIG. 1 is a schematic side view for illustrating a continuity test. The continuity test is conducted on a target object which is a wire T on a circuit board CB. The continuity test illustrated in FIG. 1 involves testing a continuity state of the wire T on the circuit board CB. In order to test the continuity state, contacts P (P1 and P2 in FIG. 1) are placed in contact with both ends of the wire T, and a current source CC connected in series to the contacts P supplies current to the wire T through the contacts P. A voltmeter V is connected to measure the voltage between the contacts P. A resistance value of the wire T is calculated from a value of the voltage measured by the voltmeter V and a value of the current fed by the current source CC. A determination as to whether or not the continuity state of the wire T is favorable is made on the basis of the calculated resistance value.

In the continuity test illustrated in FIG. 1, the voltmeter V measures the voltage after a predetermined period of time has lapsed from the start of current supply from the current source CC. Thus, the electrical characteristic of the wire T being tested can be stabilized. The voltage can be measured with high accuracy when the electrical characteristic is stabilized.

In accordance with the disclosure a change in voltage is measured upon supply of current for conducting the continuity test on the wire T, thereby determining whether or not the contact P is defective and needs to be changed. The voltmeter V measures a temporal change (successive change over time) of the applied voltage, as will be described in detail later.

Figure 2:
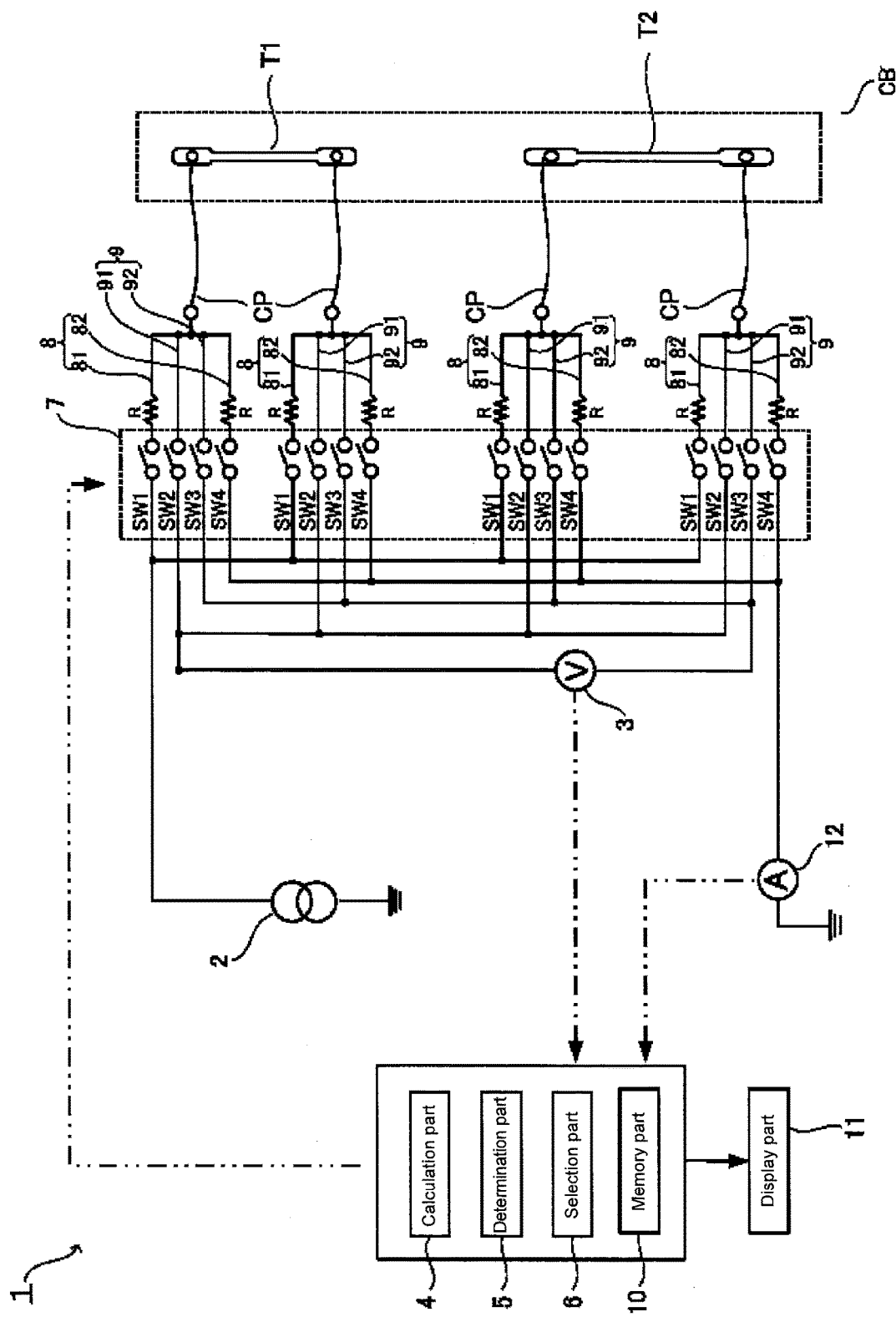
FIG. 2 illustrates a schematic configuration of a testing apparatus, and a circuit board to be tested.

Next, a description will be given of a circuit board testing apparatus 1 according to one or more embodiments of the disclosure. FIG. 2 illustrates a schematic configuration of the circuit board testing apparatus 1. The circuit board testing apparatus 1 includes a power supply part 2, a detection part 3, a calculation part 4, a determination part 5, a selection part 6, a memory part 10, a display part 11, and the like. Herein, the circuit board testing apparatus 1 is provided with a jig (not illustrated) for electrically connecting between a wire T on a circuit board CB and the circuit board testing apparatus 1. The jig has a contact CP coming into contact with a predetermined test point on the wire T.

FIG. 2 illustrates the circuit board testing apparatus 1 prepared to conduct a continuity test on the circuit board CB, and also illustrates two wires T1 and T2 on the circuit board CB. In FIG. 2, the wires T1 and T2 are subjected to a continuity test based on a two-terminal measurement method. In a case of conducting a continuity test based on a four-terminal measurement method, two contacts CP are brought into electrical contact with a first end of the wire T, and two contacts CP are brought into electrical contact with a second end of the wire T. In this case, the four-terminal measurement method is implemented using the two contacts CP connected to each of the first and second ends of the wire T, as a pair of contacts, i.e., a current feeding contact and a voltage measuring contact.

The power supply part 2 supplies power for testing the continuity state of the wire T on the circuit board CB. The power supply part 2 is capable of feeding current having at least two values, i.e., a first current value and a second current value. The power supply part 2 may be, for example, a constant current source. In this case, the power supply part 2 transmits a value of current to be fed to the wire T, as current value information, to the calculation part 4 and the like.

The detection part 3 detects voltage at the wire T being tested, in the state that the power supply part 2 supplies power to the wire T. The calculation part 4 calculates a resistance value of the wire T on the basis of the detected voltage at the wire T, as will be described later. The detection part 3 may be a voltmeter. The power supply part 2, the detection part 3, and a current detection part 12 (to be described later) are connected to the calculation part 4, the memory part 10, and the like to transmit, as information, current feeding conditions (current value, voltage value) for conduct of the continuity test, and the detected current value and voltage value.

In particular, the detection part 3 successively measures a voltage value of the wire T to which power is supplied. The detection part 3 transmits the voltage value as measurement information (voltage value information) to the memory part 10 and the like, as described above.

The calculation part 4 calculates the resistance value of the wire T being tested, on the basis of the voltage value information detected by the detection part 3. The calculation part 4 calculates the resistance value on the basis of the current value information from the power supply part 2 and the voltage value information from the detection part 3. The calculation part 4 may calculate the resistance value by performing arithmetic processing using, for example, Ohm's law. The calculation part 4 transmits the calculation result (resistance value information) to the determination part 5 and the memory part 10.

The determination part 5 determines whether or not the continuity state of the wire T being tested is favorable, on the basis of the resistance value calculated by the calculation part 4. The determination part 5 may make the determination based on the resistance value information by defining a range of resistance that identifies a favorable continuity state. When the resistance value falls within the defined range, the determination part 5 may determine that the continuity state is favorable. The determination part 5 transmits the determination result (determination information) to the memory part 10 and the display part 11.

Moreover, the determination part 5 detects whether maintenance is needed on the contact CP, on the basis of a change of the voltage value information detected by the detection part 3. The determination part 5 successively monitors the voltage value information of the wire T in the continuity test. Thus, the determination part 5 is capable of obtaining maintenance information (replacement information) on the contact CP from the change of the voltage value information.

The determination part 5 may obtain the maintenance information as follows. The determination part 5 obtains information that the contact CP should be replaced, when the voltage changes in a predetermined way when power is supplied. The determination part 5 obtains the replacement information based on whether or not there is a successive rise in voltage applied to the wire T being tested. More specifically, the determination part 5 successively stores therein the voltage value information detected by the detection part 3, thereby detecting successive changes in the voltage over time. The determination part 5 determines when it is time to replace the contact CP, on the basis of the successive change of the voltage value information. Therefore, the determination part 5 is capable of determining whether or not to replace the contact CP, in accordance with the successive change of the voltage value information.

Figure 3A:
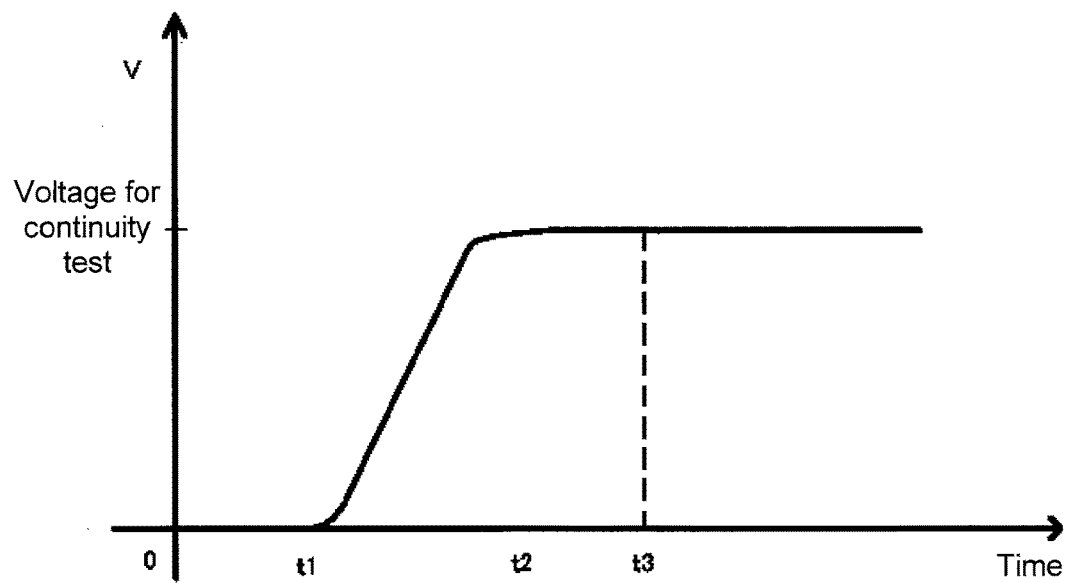
FIGS. 3A and 3B are graphs illustrating changes in voltage.
Figure 3B:
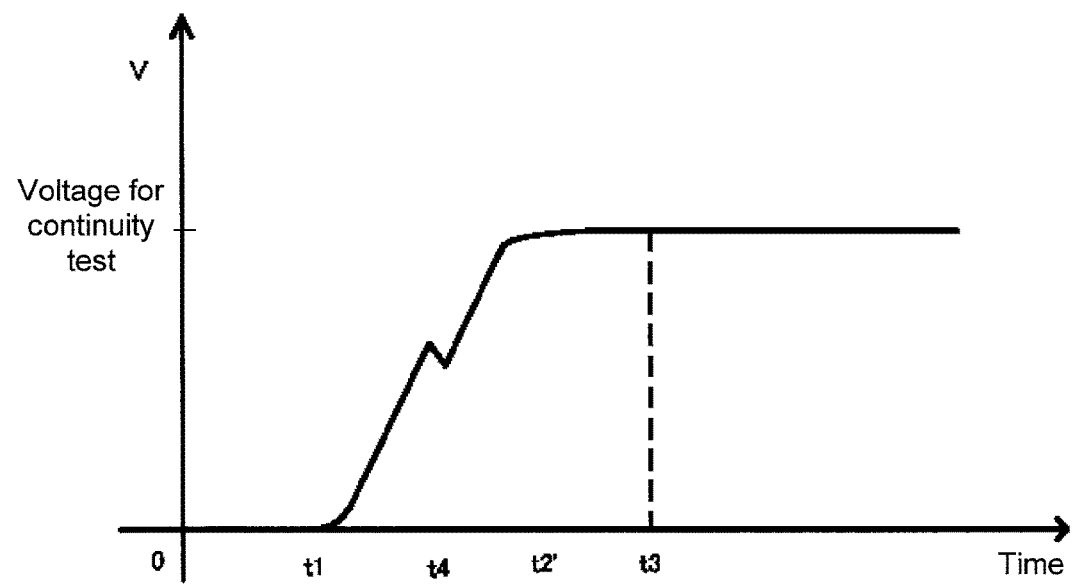

Specifically, in a case where the contact CP is normal, the voltage value initially increases at a substantially constant rate when current is supplied to a wire under test. FIG. 3A is a graph illustrating the change of the voltage value information in the case where the contact CP is normal. As illustrated in FIG. 3A, the voltage rises with a fixed gradient except for the voltage immediately after the start of power supply (around a point in time t1), and the voltage immediately before a steady voltage value is reached for conducting the continuity test (around a point in time t2). However, if the contact CP is abnormal, the voltage does not rise at a substantially fixed rate or gradient. As illustrated in FIG. 3B, for example, the voltage may temporarily drop (a temporal voltage drop at a point in time t4) or otherwise deviate from a fixed rate of rise. In the case where the voltage does not rise with a fixed gradient, there is a high possibility that the contact CP is abnormal. Identifying such phenomenon allows management of when it is time to replace the contact CP.

As described above, the determination part 5 determines that the contact CP is normal (i.e., the contact CP does not need to be replaced) in the case where the voltage value increases at a constant rate or gradient. On the other hand, the determination part 5 determines that the contact CP is abnormal (i.e., the contact CP needs to be replaced) in the case where the voltage value does not increase at a constant rate or gradient.

Specifically, the determination part 5 makes such a determination by monitoring the change of the voltage value during a period of time from the start of power supply for the continuity test to the start of measurement for the continuity test. The determination part 5 may determine that the contact CP needs to be replaced, upon detection of a negative gradient, i.e., a decrease of the voltage value.

Alternatively, the determination part 5 may make such a determination by monitoring the voltage value for a predetermined period of time when the power is supplied, and identifying how the voltage value increases in that period of time. When the voltage value does not increase at a constant rate (gradient) in the predetermined period of time, the determination part 5 determines that the contact CP needs to be replaced.

When the determination part 5 makes the determination as to the time to replace the contact CP, the display part 11 displays the contact CP and a message prompting a user to replace the contact CP.

The determination part 5 makes the foregoing determination by monitoring the voltage value information during the period of time from the start of the power supply to the conduct of the continuity test. In order to more accurately detect the time to replace the contact CP, the determination part 5 may monitor the voltage value in a multilevel manner.

For example, the determination part 5 may monitor the voltage value in a multilevel manner based on a first voltage value to be set for conducting the continuity test and a second voltage value to be set for determining the time to replace the contact CP. The first voltage value is set to be smaller than the second voltage value. In a case where the need for contact replacement is determined by a point in time when the voltage value reaches the first voltage value, the voltage value is increased to the second voltage value. The determination part 5 monitors the voltage value so as to detect the replacement information during the period of time from the first voltage value to the second voltage value. When the determination part 5 detects the need for a replacement (a predetermined change of the voltage value) during the period of time from the first voltage value to the second voltage value, then the determination part 5 issues a replacement information request on the contact CP. As described above, the determination part 5 utilizes, as preliminary replacement information, the replacement information issued by the point in time when the voltage value reaches the first voltage value. When the preliminary replacement information is detected, the voltage value is increased to the second voltage value. Thus, the determination part 5 is capable of determining whether or not the contact CP needs to be replaced, on the basis of the change of the voltage value in this interval.

Figure 4A:
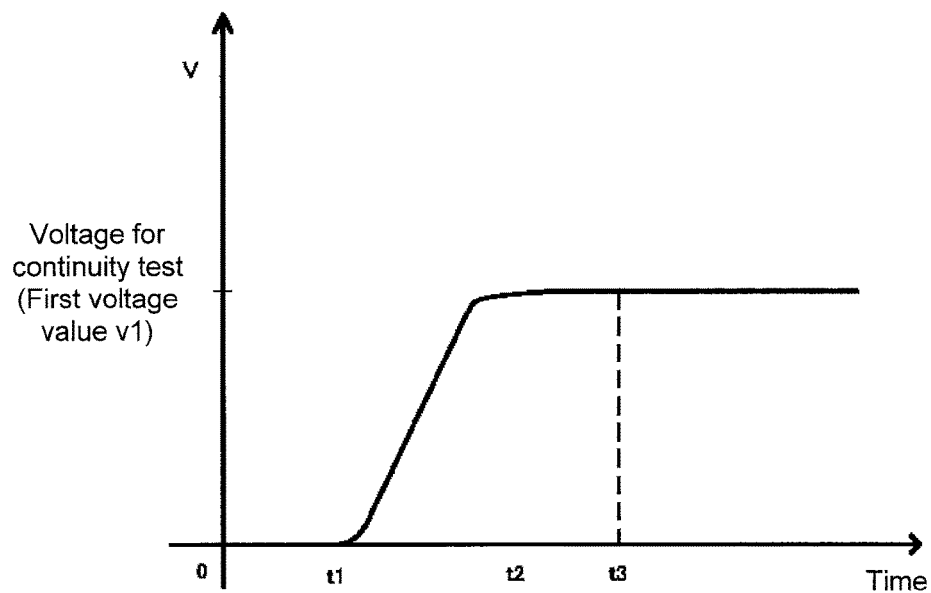
FIGS. 4A and 4B are graphs illustrating changes in voltage in a case of setting a first voltage value and a second voltage value.
Figure 4B:
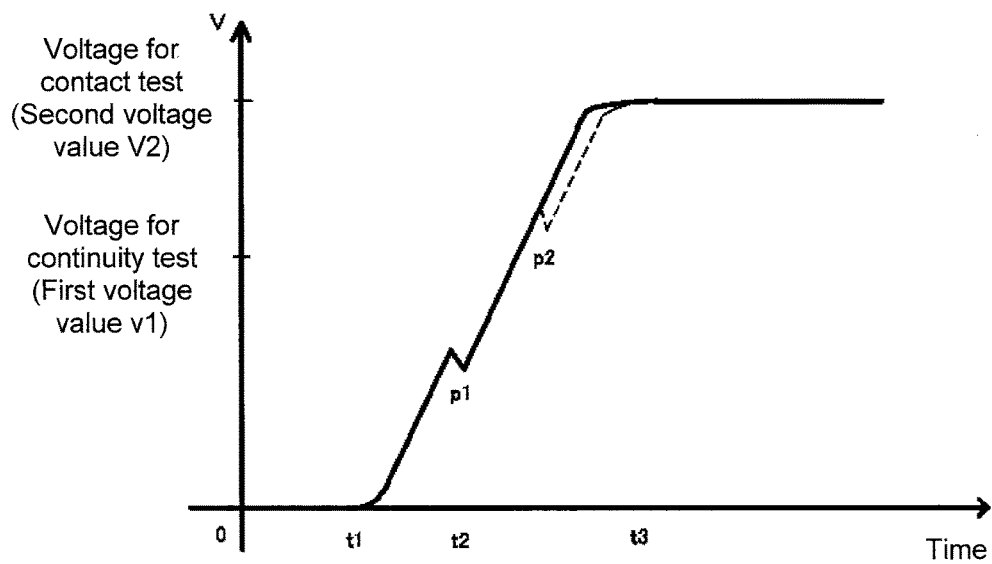

Next, a description will be given of an example illustrated in FIGS. 4A and 4B. In FIGS. 4A and 4B, V1 represents the first voltage value, and V2 represents the second voltage value. When the determination part 5 does not detect a change in voltage, such as a voltage drop, before the voltage value reaches the first voltage value V1, the continuity test is conducted at a point in time t3 illustrated in FIG. 4A. On the other hand, when the determination part 5 detects a voltage drop p1 before the voltage value reaches the first voltage value V1 as illustrated in FIG. 4B, the voltage limit value is set at the second voltage value V2. Thereafter, the determination part 5 monitors whether or not the voltage drops at the first voltage value V1 and whether or not the voltage drops at the second voltage value V2. Herein, when the determination part 5 does not detect the voltage drop in the period of time from the first voltage value V1 to the second voltage value V2, then the determination part 5 determines that the contact CP does not need to be replaced, and the continuity test is conducted. In this case, the continuity test may be conducted at the second voltage value.

Moreover, when the determination part 5 detects a voltage drop p2 in the period of time from the first voltage value V1 to the second voltage value V2, then the determination part 5 determines that the contact CP is abnormal, and the contact CP electrically connected to the target object is replaced with a new one. Preferably, the determination part 5 stores therein the point in time and the voltage value upon detection of the voltage drop p2. Particularly, storing the voltage value upon detection of the voltage drop p2 allows more accurate detection of a time to replace the contact CP.

When the determination part 5 detects the replacement information indicating that replacement of the contact may be needed in the period of time from the first voltage value V1 to the second voltage value V2, then the determination part 5 may determine whether or not the contact CP needs to be replaced, again, on the basis of the voltage value upon detection of the replacement information based upon a change in gradient in the interval. Specifically, the determination part 5 defines, as a detected voltage value, the voltage value upon detection of the replacement information in the interval from the first voltage value V1 to the second voltage value V2. Then the determination part 5 may estimate a necessity to replace the contact CP and a time to replace the contact CP, on the basis of the detected voltage value. For example, when the detected voltage value at which the gradient changes is close to the first voltage value V1 rather than the second voltage value V2, the determination part 5 may determine that the contact CP does not need to be replaced. On the other hand, when the detected voltage value is close to the second voltage value V2, the determination part 5 may determine that the contact CP needs to be replaced.

Using the detected voltage value allows estimation of the time to replace the contact CP in addition to the necessity to replace the contact CP. For example, when the detected voltage value is close to the first voltage value rather than the second voltage value, the determination part 5 may determine that the contact CP does not need to be replaced and therefore can be continuously used. On the other hand, as the detected voltage value approaches the second voltage value, the determination part 5 may determine that the contact CP needs to be replaced. In this case, a third voltage value may be set in addition to the second voltage value (first voltage value<third voltage value<second voltage value). The determination part 5 may determine that the contact CP needs to be replaced, when the voltage value exceeds the third voltage value upon detection of the replacement information.

The user may appropriately set the specific first and second voltage values depending on a target object. For example, the first voltage value may be set at 150 V, and the second voltage value may be set at 250 V. The first voltage value is a voltage limit value upon conduct of the continuity test on the target object. On the other hand, the second voltage value is a voltage value for detection of an abnormal contact CP. Therefore, these voltage values are appropriately set depending on conditions of a test.

The determination part 5 issues replacement information when the detected voltage value does not increase at a constant rate, thereby prompting the user to replace the contact CP. The replacement information from the determination part 5 may be directly processed as a time to replace a contact CP, as described above. Alternatively, a time to replace a contact CP may be determined upon reception of replacement information again with the preceding replacement information set as a trigger. The function of the determination part 5 is set in advance prior to conducting the continuity test on a target object.

The selection part 6 selects and specifies a wire T to be tested from the plurality of wires T on the circuit board CB. The wires T are sequentially selected as a target object to be subjected to the continuity test in such a manner that the selection part 6 specifies the wire T as described above. The selection part 6 may select the wire T in accordance with a preset order of wires T to be tested, and such order may be stored in the memory part 10. The selection part 6 may select the wire T as described above, but not limited thereto as long as the wires T to be tested can be selected sequentially.

Specifically, the selection part 6 selects the wire T to be tested, using a switch part 7 including switching elements SW. For example, the selection part 6 is capable of selecting the wire T by closing and opening the switching element SW of the switch part 7. The specific method of closing and opening the switching element SW is described below.

Current feeding terminals 8 are connected to the wire T via the contacts CP to feed a current to the wire T. Each of the current feeding terminals 8 includes an upstream current feeding terminal 81 and a downstream current feeding terminal 82. The upstream current feeding terminal 81 connects an upstream side (positive electrode side) of the power supply part 2 to the wire T. The downstream current feeding terminal 82 connects a downstream side (negative electrode side) of the power supply part 2 or the current detection part 12 to the wire T. As illustrated in FIG. 2, the upstream current feeding terminal 81 and downstream current feeding terminal 82 of the current feeding terminal 8 are disposed to correspond to a test point on the wire T. The upstream current feeding terminal 81 and the downstream current feeding terminal 82 are connected to the switching elements SW of the switch part 7, respectively. The upstream current feeding terminal 81 and the downstream current feeding terminal 82 are connected to and disconnected from the switching elements SW of the switch part 7 in such a manner that the switch part 7 closes and opens the respective switching elements SW. The current feeding terminal 8 may be provided with a resistor for protection from electrostatic discharge.

Voltage detecting terminals 9 are connected to the wire T via the contacts CP to detect voltage at the wire T. Each of the voltage detecting terminals 9 includes an upstream voltage detecting terminal 91 and a downstream voltage detecting terminal 92. The upstream voltage detecting terminal 91 connects an upstream side (positive electrode side) of the detection part 3 to the wire T. The downstream voltage detecting terminal 92 connects a downstream side (negative electrode side) of the detection part 3 to the wire T. As illustrated in FIG. 2, the upstream voltage detecting terminal 91 and downstream voltage detecting terminal 92 of the voltage detecting terminal 9 are disposed to correspond to the test point on the wire T. As in the case of the current feeding terminal 8, the upstream voltage detecting terminal 91 and the downstream voltage detecting terminal 92 are connected to the switching elements SW of the switch part 7, respectively. The upstream voltage detecting terminal 91 and the downstream voltage detecting terminal 92 are connected to and disconnected from the switching elements SW of the switch part 7 in such a manner that the switch part 7 closes and opens the switching elements SW.

As illustrated in FIG. 2, the four terminals of the current feeding terminal 8 and voltage detecting terminal 9 are connected to one contact CP which is in electrical contact with the test point on the wire T. The four terminals of the current feeding terminal 8 and voltage detecting terminal 9 are also connected to the four switching elements SW for performing the ON/OFF control on the respective terminals.

The switch part 7 includes the plurality of switching elements SW electrically connected to the corresponding terminals. The switch part 7 closes and opens each switching element SW on the basis of an operation signal from the selection part 6, as will be described later.

Next, a description will be given of a specific method of selecting a wire T to be tested.

Figure 5:
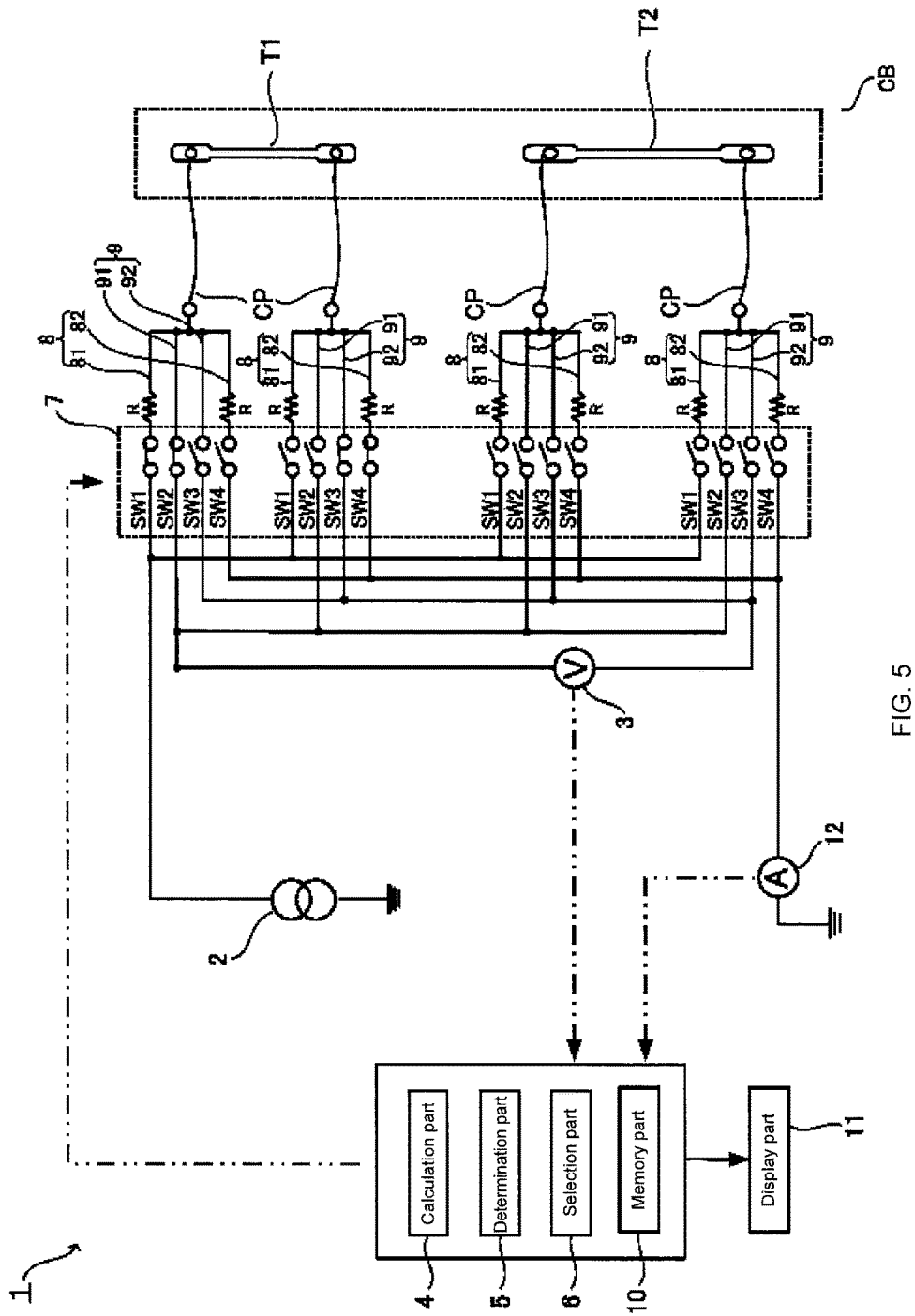
FIG. 5 exemplarily illustrates a continuity test to be conducted using the testing apparatus.

FIG. 5 illustrates a case where a wire T1 is a target object to be subjected to the continuity test. In this case, the switching element SW1 is closed to electrically connect the upstream current feeding terminal 81, which is connected to a first end P1 a of the wire T1, to the upstream side of the power supply part 2. At the same time, the switching element SW2 is closed to electrically connect the upstream voltage detecting terminal 91, which is connected to the first end P1 a of the wire T1, to the upstream side of the detection part 3. On the other hand, the switching element SW4 is closed to electrically connect the downstream current feeding terminal 82, which is connected to a second end P1b of the wire T1, to the downstream side of the power supply part 2 (or the current detection part 12). At the same time, the switching element SW3 is closed to electrically connect the downstream voltage detecting terminal 92, which is connected to the second end P1b of the wire T1, to the downstream side of the detection part 3. Thus, the selection part 6 is capable of selecting the wire T to be tested, by closing and opening the switching element SW of the switch part 7.

The circuit board testing apparatus 1 may include the current detection part 12. The current detection part 12 is capable of detecting current flowing through a wire T being tested. The current detection part 12 is capable of detecting current fed from the power supply part 2 for the purpose of a check.

The memory part 10 stores therein information for conducting the continuity test on a wire T on the circuit board CB. The continuity test is conducted on all the wires T on the basis of the information stored in the memory part 10. The memory part 10 may also store therein results of processing by the respective parts. The memory part 10 successively stores therein the detection results by the detection part 3 such that the determination part 5 detects the change in voltage value. The determination part 5 detects the change in voltage value on the basis of the voltage value information stored in the memory part 10.

The display part 11 displays, for example, the information on the current fed from the power supply part 2, the information on the detection by the detection part 3, and the information on the determination by the determination part 5. The information displayed on the display part 11 allows the user of the circuit board testing apparatus 1 to understand the state and result of the continuity test.

In the foregoing description, a contact CP is in contact with a target object T. The number of contacts CP coming into contact with the target object T is not limited to two as illustrated in FIG. 1. For example, in a case where two contacts CP are in contact with a target object T, determination as to whether or not the contact CP is abnormal may be made on each of the two contacts CP or may be made on the contact CP electrically connected to the positive electrode of the power supply part 2. In the case where the determination is made on the contact CP electrically connected to the positive electrode of the power supply part 2, the other contact CP can be subjected to the same test by changing the polarity.

The foregoing description concerns the configuration of the circuit board testing apparatus 1 according to one or more embodiments of the disclosure.

Next, a description will be given of the operations of the circuit board testing apparatus 1. Herein, one of the wires T on the circuit board CB is selected as a target object, and then is subjected to the continuity test. When the wire T is determined to be favorable, the next wire T is selected as a target object, and then is subjected to the continuity test. In the following, the selecting method is not described, but the continuity test to be conducted on a wire T selected as a target object is specifically described.

An exemplary description will be given of the circuit board testing apparatus 1 in which only the first voltage value is set. Herein, the first voltage value is set at, for example, 250 V. When the first voltage value is set, the continuity test is conducted on the wire T to be tested. FIG. 5 illustrates the continuity test conducted on the wire T1 selected as a target object. The selection part 6 transmits a signal to close or open the switching element SW of the switch part 7 in accordance with the order of wires T to be tested. When a wire T1 is selected as a target object, the continuity test is conducted on the wire T1. The detection part 3 detects a value of voltage applied to the wire T1. Moreover, the detection part 3 monitors the voltage value of the wire T1 during the period of time from the start of voltage application to the wire T1 to the conduct of the continuity test.

The determination part 5 monitors the change of the voltage value detected by the detection part 3, during the period of time from the start of voltage application to the conduct of the continuity test. When the voltage value increases at a constant rate, the determination part 5 issues no replacement information. In other words, the determination part 5 determines that the contact CP is normal. Therefore, the contact CP continues to be used.

On the other hand, when the voltage value does not increase at the constant rate, specifically, when the voltage value decreases, the determination part 5 issues the replacement information. In other words, the determination part 5 determines that the contact CP is abnormal. Therefore, the contact CP is replaced with a new one after the continuity test. As described above, the method according to one or more embodiments of the disclosure is capable of determining a time to replace a contact CP before a continuity test cannot be conducted on a target object. Therefore, the method according to one or more embodiments of the disclosure is capable of reducing a cause of a contact failure of a contact with a target object, and is capable of preventing reduction in productivity due to the contact failure.

Next, a description will be given of a case of setting the first voltage value and the second voltage value. In a case of managing the maintenance of a contact on the basis of the first voltage value and the second voltage value, the first voltage value is set as a voltage limit value for conducting the continuity test on a target object, and the second voltage value is set as a voltage value for testing as to whether a contact is abnormal. In this case, for example, the first voltage value is set at 150 V, and the second voltage value is set at 250 V.

Next, the power supply part 2 supplies power for conducting the continuity test on the target object. The power supplied from the power supply part 2 has the first voltage value as the voltage limit value. The detection part 3 continuously detects the voltage value of the target object, and transmits the detected voltage value during the period of time from the start of voltage application to the finish of the continuity test. The determination part 5 detects a change of the successively stored voltage values. With regard to the successive change, the determination part 5 monitors whether the voltage value increases at a constant rate. When the voltage value increases at a constant rate, the determination part 5 determines that the contact CP is normal. Thus, the continuity test may be conducted.

When the determination part 5 determines that the voltage value does not increase at a constant rate (for example, when the determination part 5 detects a voltage drop), the voltage limit value is changed to the second voltage value. Then the determination part 5 monitors the change in voltage value from the first voltage value to the second voltage value. The determination part 5 monitors whether the voltage value increases from the first voltage value to the second voltage value at a constant rate. When it is determined that the voltage value increases at a constant rate, the continuity test is conducted. On the other hand, when the voltage value does not increase at a constant rate because of, for example, a voltage drop, the determination part 5 determines that the contact CP needs to be replaced, and then transmits replacement information indicating that the contact CP should be replaced.

The disclosure has been specifically described and illustrated in connection with one or more embodiments. However, it is clearly understood that the embodiments are by way of illustration and example only and are not to be taken by way of limitation. The spirit and scope of the invention are limited only by the terms of the appended claims.

What is claimed is:

1. A method for determining when maintenance may be required on contacts used with a testing apparatus to connect an object to be subjected to an electrical test by said testing apparatus, the method comprising:
    momentarily bringing one or more of said contacts into contact with test points on the object,
    supplying power from said testing apparatus to a selected test point through its corresponding contact;
    said testing apparatus detecting changes in voltage at the contact to which the power is supplied; and issuing maintenance information indicating that the contact may be abnormal based upon detecting said changes in voltage; and
    wherein the maintenance information indicating that the contact is abnormal is issued when the voltage does not successively rise during a first voltage interval having a preset upper voltage value and during a second voltage interval ranging from said preset upper voltage value to a higher voltage value.

2. The method of claim 1, wherein the electrical test conducted on the object is a an electrical continuity test.

3. The method of claim 1, wherein said object is a wire on a circuit board.

* * * * *